United States Patent
Gerphagnon et al.

(10) Patent No.: US 11,455,584 B2
(45) Date of Patent: Sep. 27, 2022

(54) METHOD OF AIDING THE DESIGN OF A DATA CENTER

(71) Applicant: BULL SAS, Les Clayes sous Bois (FR)

(72) Inventors: Jean-Olivier Gerphagnon, Seyssins (FR); Andry Razafinjatovo, Renage (FR); Cédric Lambert, Saint Romans (FR)

(73) Assignee: BULL SAS, Les Clayes-sous-Bois (FR)

( * ) Notice: Subject to any disclaimer, the term of this patent is extended or adjusted under 35 U.S.C. 154(b) by 985 days.

(21) Appl. No.: 14/378,626

(22) PCT Filed: Feb. 15, 2013

(86) PCT No.: PCT/FR2013/050309
§ 371 (c)(1),
(2) Date: Aug. 13, 2014

(87) PCT Pub. No.: WO2013/121154
PCT Pub. Date: Aug. 22, 2013

(65) Prior Publication Data
US 2015/0088579 A1    Mar. 26, 2015

(30) Foreign Application Priority Data
Feb. 15, 2012    (FR) .................................. 1251394

(51) Int. Cl.
*G06Q 10/06*    (2012.01)
*G06Q 10/04*    (2012.01)
*G06F 30/00*    (2020.01)

(52) U.S. Cl.
CPC ....... *G06Q 10/06313* (2013.01); *G06Q 10/04* (2013.01); *G06Q 10/067* (2013.01); *G06F 30/00* (2020.01)

(58) Field of Classification Search
CPC ............. G06Q 10/06313; G06Q 10/04; G06Q 10/067; G06F 30/00
See application file for complete search history.

(56) References Cited

U.S. PATENT DOCUMENTS

| | | | |
|---|---|---|---|
| 6,169,987 B1* | 1/2001 | Knoblock | G06F 17/5004 |
| 7,313,503 B2* | 12/2007 | Nakagawa | G06F 17/5009 |
| | | | 62/441 |
| 2003/0115024 A1* | 6/2003 | Snevely | G06F 17/50 |
| | | | 703/1 |
| 2003/0126202 A1* | 7/2003 | Watt | G06F 9/4401 |
| | | | 709/203 |
| 2005/0289495 A1* | 12/2005 | Raghunandran | G06F 30/39 |
| | | | 716/112 |
| 2006/0015589 A1* | 1/2006 | Ang | H04L 67/34 |
| | | | 709/220 |

(Continued)

OTHER PUBLICATIONS

Data Center Cabling Guide; Planning Your Data Center Version 2; 2009;www.beldensolutions.com (Year: 2009).*

(Continued)

*Primary Examiner* — Robert D Rines
*Assistant Examiner* — Alissa D Karmis
(74) *Attorney, Agent, or Firm* — Arc IP Law, PC; Joseph J. Mayo

(57) ABSTRACT

A method of aiding the design of a data center is disclosed. In one aspect, the method refers to generating a list of components from a library that satisfy a defined list of needs.

26 Claims, 6 Drawing Sheets

(56) References Cited

U.S. PATENT DOCUMENTS

| | | | | |
|---|---|---|---|---|
| 2007/0038414 | A1* | 2/2007 | Rasmussen | G06F 1/206 703/1 |
| 2008/0158818 | A1* | 7/2008 | Clidaras | G06F 1/206 361/699 |
| 2008/0188969 | A1* | 8/2008 | O'Malley | G06F 17/50 700/97 |
| 2009/0313002 | A1* | 12/2009 | Akselrod | G06F 30/36 703/18 |
| 2010/0198563 | A1* | 8/2010 | Plewe | G06F 30/392 703/1 |
| 2010/0201684 | A1* | 8/2010 | Yadav | G06T 17/10 345/420 |
| 2011/0106501 | A1* | 5/2011 | Christian | H04L 67/16 703/1 |
| 2011/0153684 | A1* | 6/2011 | Yung | G06F 9/45533 707/805 |
| 2012/0116728 | A1* | 5/2012 | Shear | G06T 19/006 703/1 |
| 2012/0209573 | A1* | 8/2012 | Karrat | G06Q 10/067 703/1 |

OTHER PUBLICATIONS

Neil Rasmussen and Suzanne Niles. Data Center Projects: System Planning. White Paper #142 Published by American Power Conversion (APC) 2007. (Year: 2007).*

Sun Microsystems Data Center Site Planning Guide. Jan. 2003. https://docs.oracle.com/cd/E19065-01/servers.e25k/805-5863-13/805-5863-13.pdf (Year: 2003).*

Official Journal of the European Patent Office, dated Nov. 2007, pp. 594-600.

International Search Report dated Apr. 25, 2013 for International Patent Application No. PCT/FR2013/050309, filed Feb. 15, 2013, and of which captioned U.S. Appl. No. 14/378,626 is a National Stage Entry.

* cited by examiner

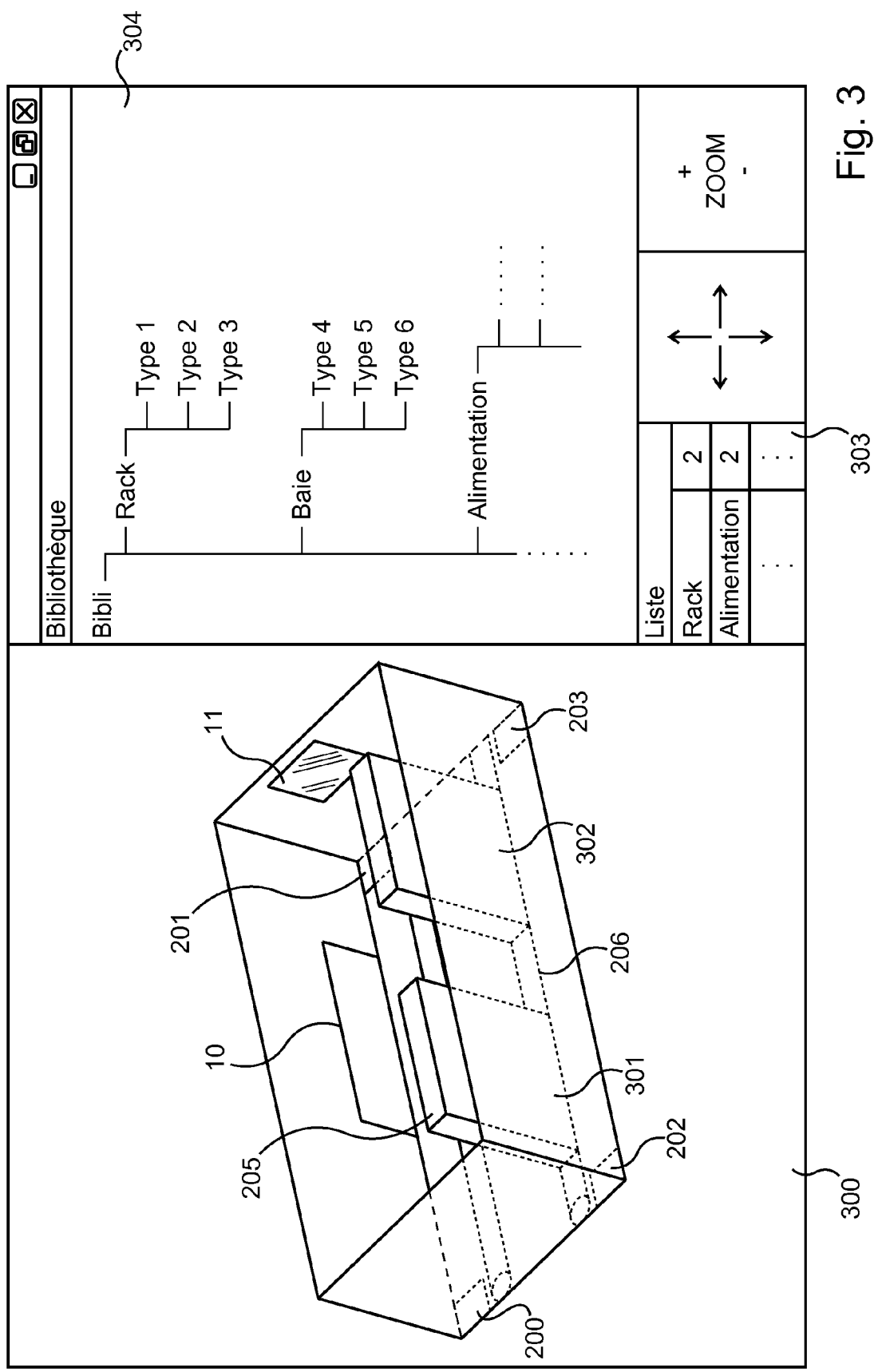

METHOD OF AIDING THE DESIGN OF A DATA CENTER

CROSS-REFERENCE TO RELATED APPLICATIONS

This application is a nationalization of and claims priority to PCT/FR2013/050309, the entirety of which is hereby incorporated by reference.

BACKGROUND OF THE INVENTION

Technological Field

The present invention concerns the field of high performance computers, generally designated as HPC clusters (HPC standing for "High Performance Computing"). The present invention more particularly concerns the design of such high performance computers.

Description of the Related Technology

Even before the installation of an HPC cluster on a physical premises, and even before its design, the question arises of the feasibility and of the cost of such an installation project.

Typically, when an establishment (a company, research center or other establishment) wishes to equip itself with an HPC cluster, it draws up a brief specifying the desired performance for the cluster. It specifies for example a combination of important factors such as a computation capacity in flops (acronym for "Floating point Operations Per Second"), a bandwidth (en Gb/s), a number of inputs/outputs per second (in IOPS), an electrical consumption (in W, KW, MW), heat dissipation or other factors. It also gives a description of a physical premises to receive the high performance computer.

It is rarely possible for the designer of the high performance computer to modify the premises in order for it to be adapted to the high performance computer. In reality, it falls to the designer of the high performance computer to adapt the system to the premises provided by the establishment.

Thus, before the industrial launch of the design of a high performance computer meeting the establishment's brief, the designer must be able to ensure that the technology at his disposal can enable him to produce a high performance computer adapted to the premises provided for receiving it within acceptable costs.

According to the prior art, the description of an HPC cluster is made by means of software of "spreadsheet" type making it possible to precisely write the type and number of each item of equipment (or component) constituting the cluster.

This solution is difficult to implement at large scale since a cluster comprises thousands, or even tens of thousands, of different items of equipment. To be precise, it is difficult for a designer to mentally manage a spreadsheet containing thousands of inputs (or even hundreds of thousands). The time of integration and management of linear data in the form of tables is not optimal and does not enable viewing or strong interaction between components. Furthermore, this solution does not make it possible to really take into account the final physical installation of the cluster.

It may thus occur that the designer puts in place a cluster architecture meeting the fixed brief but that this architecture turns out to be very difficult or even impossible to physically install in the provided premises. Such a situation thus requires either completely revising the architecture, or carrying out adaptation works of the premises which in both cases can generate high costs which were probably not planned in the initial budget for design and installation of the cluster.

There is thus a need to aid the design of high performance computers (HPC clusters), in particular to make it possible to take into account, early in the industrial process of design, of the final physical installation of the high performance computer.

SUMMARY OF CERTAIN INVENTIVE ASPECTS

A first aspect of the invention concerns a method of aiding the design by computer of a data center comprising the following steps:
  geometrically defining a premises provided for receiving the data center,
  defining physical constraints associated with said premises,
  supplying a library of data center components for a hardware definition of said data center, said library being associated with a set of installation rules for said components in a data center.
  defining a list of needs to satisfy by the data center, and
  generating a list of components of the library capable of satisfying said list of needs based on an application of at least one installation rule, said components of the list complying with said definitions and it being possible for said list to be empty if it is not possible to find components complying with said definitions and said rules.

The present invention provides an innovative approach to the response to a request to create a new data center (cluster) by a method integrating early in the design of the data center the final installation thereof in the premises provided for that purpose.

The present invention may also enable early detection of the problems that may arise with regard to complying with constraints of low predictability at the start of a project for example such as technical needs that are difficult to meet, an unsuitable premises, or other constraints.

The present invention also makes it possible to make fine economic estimations concerning the final cost of the data center not only in terms of hardware constituting the cluster but also in terms of adaptation works to carry out to receive a cluster meeting the needs.

The present invention satisfies the increasing need to plan in advance for the feasibility of a data center in order to be able to meet budgets and deadlines allotted for putting in place these complex systems.

More particularly, data centers are attaining increasingly large sizes with sometimes several hundreds of kilometers of cables of different sizes and types, different models of nodes, storage, network switching, etc.

The present invention gives an alternative to the purely intellectual design according to the prior art which is becoming very difficult to implement.

The present invention makes it possible to take into account constraints given by the brief (or the technology used) and induced constraints. The "induced" constraints are induced for example in the sense that certain cables cannot measure more than "n meters", cannot have a radius of curvature of more than "x degrees", etc. They are also induced for example in the sense that it is not possible to place an item of equipment of a certain type beside an item of equipment of another type (on account of problems of heat transfer for example).

These constraints may be defined and managed according to installation rules.

One or more hardware dependency rules may be implemented whereby the installation of one component involves the installation of at least one other component.

This makes it possible to more finely examine the set of equipment to provide in the final installation of the data center. It is then easier to estimate the cost, the size, the electrical consumption, the heat dissipation or other criteria.

Thus, when the presence of a component is dictated by a requirement of the needs to be satisfied, the all the hardware necessary for the proper operation of the component is also included in the list generated.

For example, the list of components is generated on the basis of a preexisting virtual representation of a data center.

Thus, it is possible to take into account data center projects already completed. This may enable the method to be accelerated.

The method may furthermore comprise the following steps:
displaying a geometrical representation of said premises, and
displaying components of said list of components within the displayed geometrical representation of the premises.

The method according to the invention may thus be associated with a graphical interface enabling a user to have a realistic vision of the data center and to be able to make modifications intuitively.

The method may furthermore comprise a step of implementing an algorithm for optimization of distance between the components to distribute said components of the list of components in said geometrical representation of the premises.

Thus, the cabling of the data center may be reduced. As a matter of fact, the premises provided to receive the clusters are typically provided with false floors and/or false ceilings. The cabling structure must therefore be considered in three dimensions with several levels of cabling.

Furthermore, the space occupied on the ground or the thermal distribution of the items of equipment may be optimized. For example, it may be a matter of optimally distributing the "hot" equipment and the "cold" equipment in order to optimize the energy footprint.

The method may furthermore comprise the following steps
receiving an order to modify the list of components generated,
applying at least one installation rule to determine whether it is possible to modify the list, and
modifying or not modifying the list according to a result of the step of applying said at least one rule.

It is thus possible in real time to modify a data center configuration already generated.

The display of the components of the list of components may thus be modified.

Modifying the list may be coupled to a graphical interface which displays at the same time a representation of the data center and a representation of the library of components so enabling the user to add components of the library to the representation of the data center. The user may also delete components from the representation of the data center.

The physical constraints comprise at least one of:
a maximum weight supported by the premises,
a maximum electrical power supported,
a maximum air-conditioning power available,
a configuration of cable raceways,
a water supply configuration,
a configuration of a network connection with the outside,
a configuration of electrical connections,
a configuration of cold points,
a configuration of hot points.

The constraints may be overall (that is to say concerning the premises in its entirety) or local (for example a maximum weight supported per panel of false floor, electrical constraints per zone or per rack, air-conditioning constraints per zone or per rack, or other constraints).

The list of needs comprises at least one of:
computation performance needs,
memory quantity needs,
bandwidth needs,
data rate needs.

The bandwidths may concern the networks (for example the "interconnect"), the storage, the memory, etc.

A second aspect of the invention concerns a computer program as well as a computer program product and a storage medium for such program and product, enabling the implementation of a method according to the first aspect of the invention, when the program is stored in a memory of a device for aiding the design by computer of a data center and executed by a processor of such a device.

A third aspect of the invention concerns a device for aiding the design by computer of a data center.

Such a device comprises:
a communication unit configured to receive a geometrical definition of a premises provided to receive the data center, a definition of physical constraints associated with said premises and a definition of a list of needs to satisfy by the data center, and
a processing unit configured to generate a list of components of a library of data center components for a hardware definition of said data center, said library being associated with a set of rules for installation of said components in a data center, said components of the list being capable of satisfying said list of needs based on an application of at least one installation rule, said components of the list complying with said definitions and it being possible for said list to be empty if it is not possible to find components complying with said definitions and said rules.

The device may furthermore comprise a memory unit configured to store said library.

The communication unit may furthermore be configured to communicate with a server storing said library.

The processing unit may furthermore be configured to implement a hardware dependency rule whereby the installation of one component involves the installation of at least one other component.

The list of components may be generated on the basis of a preexisting virtual representation of a data center.

The processing unit may furthermore be configured to control the display of a geometrical representation of said premises, and of the components of said list of components within the displayed geometrical representation of the premises.

The processing unit may furthermore be configured to implement an algorithm for optimization of distance between the components to distribute said components of the list of components in said geometrical representation of the premises.

According to embodiments:
the communication unit is configured to receive an order to modify the list of components generated, and the processing unit is furthermore configured to apply at least one installation rule to determine whether it is possible to modify the list, and to modify or not modify the list according to a result of the step of applying said at least one rule.

The processing unit may furthermore be configured to control a modification of the display of said components of the list of components.

The objects according to the second and third aspects of the invention procure at least the same advantages as those procured by the method according to the first aspect. The device according to the third aspect may comprise means for the implementation of optional features referred to for the first aspect in terms of method.

BRIEF DESCRIPTION OF THE DRAWINGS

Other features and advantages of the invention will appear on reading the present detailed description which follows, by way of non-limiting example, and the appended drawings among which:

FIG. 3 illustrates a graphical interface according to an embodiment;

DETAILED DESCRIPTION OF CERTAIN ILLUSTRATIVE EMBODIMENTS

Figure 1:
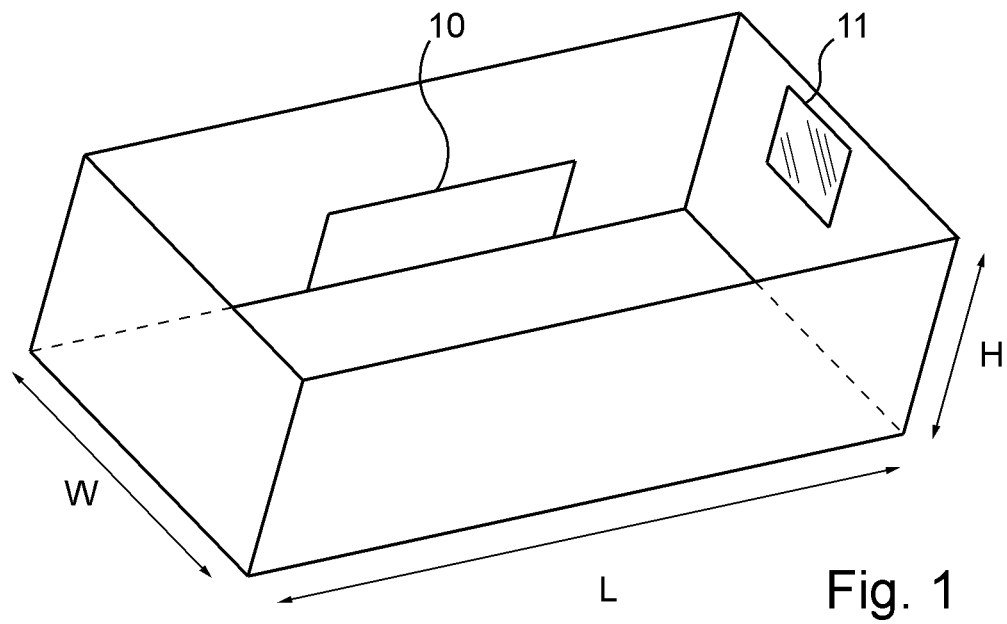
FIG. 1 illustrates a geometrical definition of a premises to receive a data center.

In the description which follows, a tool for aiding the design of a high performance computer of "HPC cluster" type is disclosed. This tool enables a designer to rapidly evaluate the industrial feasibility of a project for a high performance computer taking into account the physical installation thereof in a premises provided for that purpose.

It is a tool belonging to the industrial process of optimized design for a high performance computer to meet not only the needs in terms of performance of the high performance computer but also the needs in terms of physical installation and cost of setting-up.

When it is a matter of creating a new high performance computer, a brief is drawn up comprising a set of needs that the high performance computer must satisfy, for example a computation capacity in flops (for example teraflops), a memory capacity (for example in petaBytes), a data rate (inputs/outputs per second) or other needs.

These performances may be attained by associating components typically present in a high performance computer: storage server, compute nodes, or other components. Typically, these components are associated with other hardware for example such as supplies, cooling systems, network switches, or other components. In general, all the equipment is grouped together into data center cabinets commonly designated "racks".

All the items of equipment (or components) of a high performance computer are interconnected, directly or indirectly, which requires connection cables and associated connection components (ports, plugs or other components).

Based on the brief, it is possible to determine a set of components which, once associated together, will be able to constitute a cluster satisfying the needs expressed.

According to an example, if a cluster must be able to store 800 TB (terabytes), and a server can store 80 TB, it is possible to deduce that the cluster must comprise 10 servers. It is also possible to deduce the type and the number of additional items of equipment associated with those 10 servers for example such as the number of electrical supplies necessary, the type of cooling and number of racks necessary to group together those components.

According to another example, the components to constitute the cluster are chosen on the basis of previous projects.

For example, "standard" architectures may be kept in a rack and be re-used and possibly re-adapted. It may be a matter of structures pre-defined for the networks, the storage (or other requirement) the optimal character and topology of which is known. The design of the cluster may thus be automated taking as a basis topological constraints apart from purely hardware constraints. It is thus possible to optimize the real performance available contrary to purely theoretical optimizations derived from theoretical technical data.

At this stage of the design, there is only available a list of components to associate to form the high performance computer.

According to the invention, the configuration of the premises provided to receive the high performance computer is also taken into account.

Thus, the premises is geometrically defined, for example taking into account its dimensions in three dimensions. A geometrical representation in three dimensions is illustrated in FIG. 1. According to the example of FIG. 1, the premises is a parallelepiped of length L, width w and height H. The premises comprises an entry door 10 and a ventilation opening 11. The dimensions of the door and of the ventilation opening are assumed to be known.

The geometrical definition of the premises makes it possible to take into account the available area and ceiling height available to install the data center racks. In particular, it is possible to know the irregularities in the available space. Indeed, it may happen that the premises provided for the high performance computer are not perfectly parallelepipedic and that for example the ceiling height is not uniform or that the area of the premises is not rectangular.

Once the geometrical definition of the premises is known, it is already possible to know whether the components available to produce the cluster may be created in the premises. Arrangements of greater or lesser complexity may be envisioned according to installation rules for the racks. For example, it is possible to provide or not provide spacing between the racks.

Also defined are the geometrical configuration of the premises and the physical constraints associated with the premises.

To be precise, the items of equipment required to constitute the cluster may need particular arrangements. For example, an item of equipment requiring cooling by water circulation must be placed close to a water source. Similarly, the disposition of the electrical sources may influence the positioning of the racks in the premises.

Figure 2A:
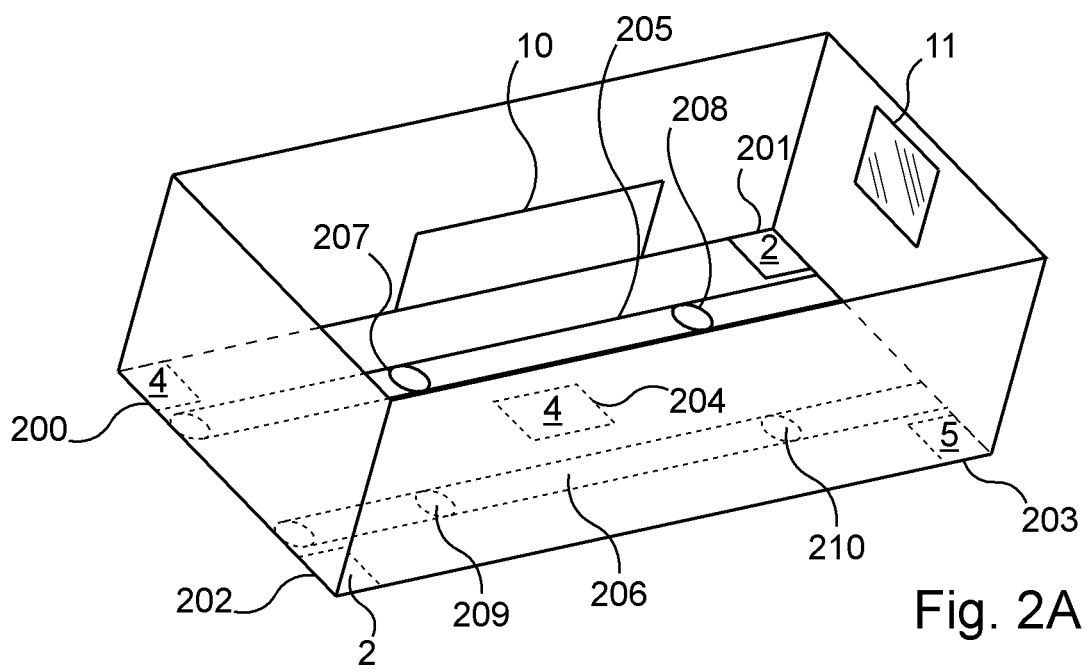
FIGS. 2A-2E illustrate representations of the physical constraints associated with a data center.

FIG. 2A illustrates certain physical constraints that may be associated with the premises of FIG. 1.

The presence of a door 10 and of a ventilation opening 11 in itself represents a constraint.

Furthermore, the electrical sources are of a limited number and at fixed positions. Furthermore, several types of electrical sources are available. An electrical source 200 of 4 MW is situated on the ground in a first corner of the premises on the same side as the door. An electrical source 201 of 2 MW is situated on the ground in a second corner of the premises on the same side as the door. Another electrical source 202 of 2 MW is situated on the ground in a third corner of the premises opposite the door. An electrical source 203 of 5 MW is situated on the ground in a fourth corner of the premises opposite the door. Lastly, an electrical source 204 of 4 MW is located on the floor in the center of the premises.

The premises further comprises two cable raceways 205 and 206 passing longitudinally across the premises and respectively comprising two openings 207, 208 and 209, 210. These cable raceways make it possible to receive the electrical cables and the network cables linking the various items of equipment of the cluster.

The premises may also comprise zones with higher or lower temperature, for example on account of the distribution of the ventilation openings. It is then possible to define cold points, that is to say zones at relatively low temperature and hot points, that is to say zones at relatively high temperature. Typically, the equipment requiring strong cooling must preferably be placed in the vicinity of cold points and it must be avoided to place them in the vicinity of the hot points.

The configuration according to FIG. 1A is purely illustrative. Other configurations of network cabling, of electrical cabling or of (cooling) water distribution networks may be envisioned.

Figure 2B:
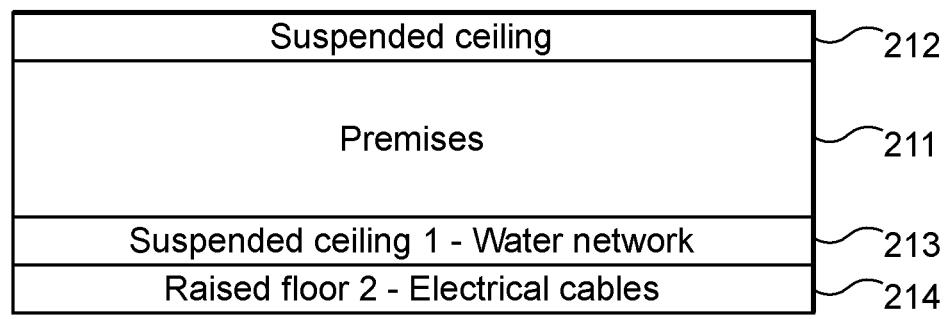

For example, FIG. 2B illustrates a premises 211 with a suspended ceiling 212, and a raised floor with several levels, for example here two levels 213, 214. The suspended ceiling could also comprise several levels.

Figure 2C:
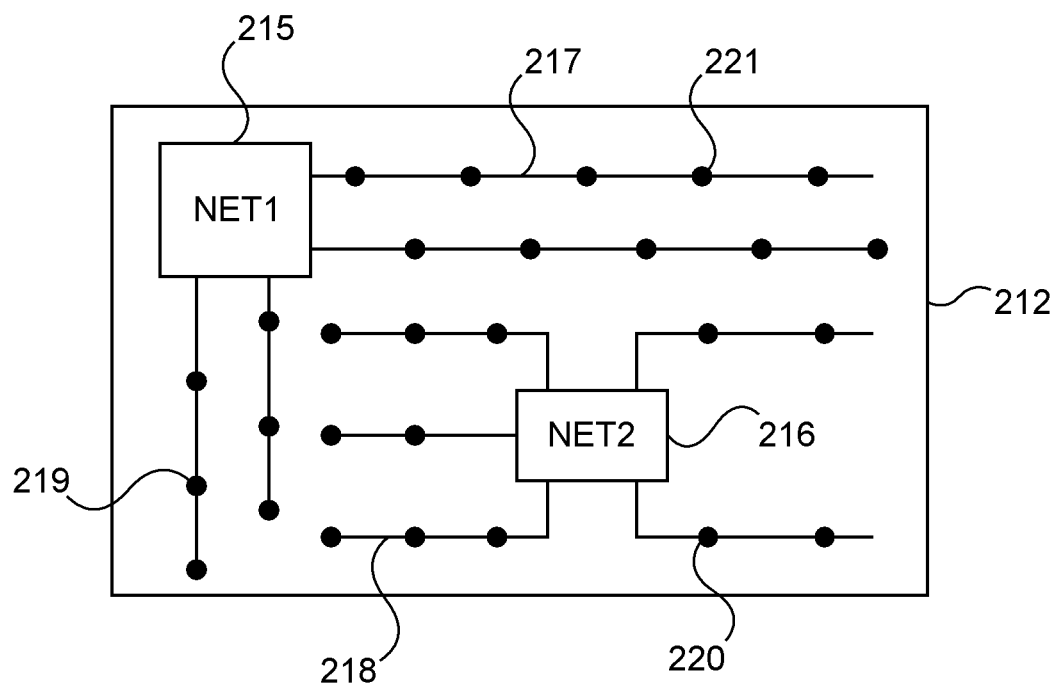

For example, the suspended ceiling comprises a network of network cabling, as illustrated in FIG. 2C which is a view from above of the suspended ceiling. This network comprises network hub 215 (NET1) and 216 (NET2) from which extends a network of communication cables 217, 218. On these communication cables are disposed connection ports 219, 220, 221 which are accessible from the premises 211. These connection ports enable the racks to be connected. The position of these connection ports may depend on the configuration of the suspended ceiling, for example on account of the available space to place the hubs 215 or 216.

Figure 2D:
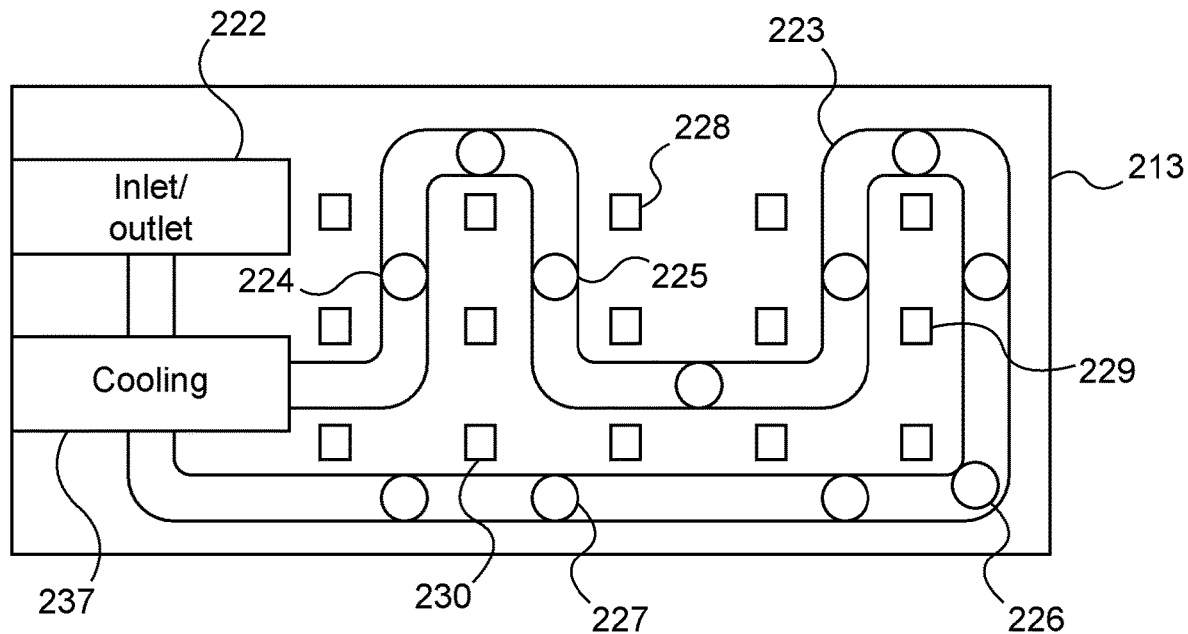

The first level of raised floor 213 comprises for example a cooling water distribution network as illustrated by FIG. 2D which is a view from above of this first level of raised floor. This level of raised floor comprises a water inlet and a water outlet 222 to supply and to drain a cooling circuit 223. The water inlet supplies the circuit 223 via a cooling module 237. The cooling circuit follows a serpentine path in the raised floor so as to cover the area under the premises. Connection points 224-227 are present regularly on the circuit and are accessible from the premises in order to connect racks to cool them by circulation of water cooled by the cooling module. Given the direction of circulation of the water, for example passing first of all by point 224 to point 227, the water available at point 224 is colder than the water available at point 227 since at point 224, is has come directly from the cooling module. This may constitute a positioning constraint for the racks requiring the most cooling, these preferably being connected to the coldest connection points. Lastly, the level of raised floor 213 comprises (upwardly and downwardly) passages for electrical cables 228-230 to allow electrical cables to pass from the lower level of raised floor 214 to the premises.

Figure 2E:
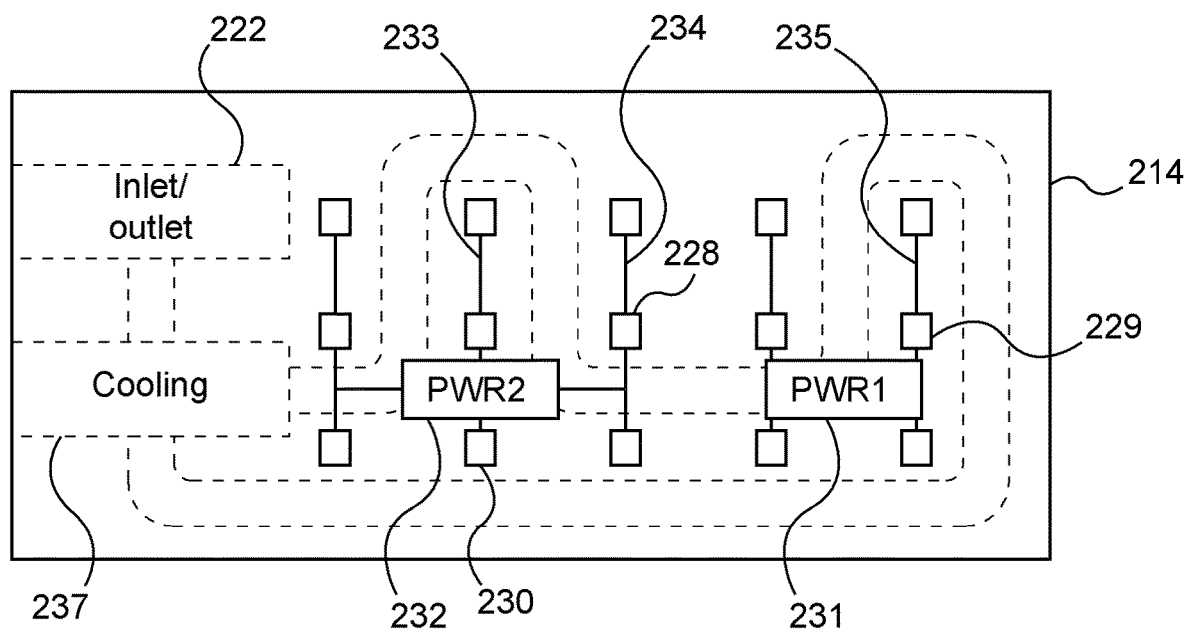

The second level of raised floor 214 comprises for example an electrical power distribution network as represented by FIG. 2E which is a view from above of the second level of raised floor. This level of raised floor comprises two power sources 231 (PWR1), 232 (PWR2). For example, the source 231 has a lower power than the source 232. From these power sources extend power distribution cables 233, 234, 235 according to a grid of the area of the premises. For example, the grid depends on the position of the power sources which may be given by the point of entry to the power network of the building in which the premises is located. This grid may also depend on the cooling circuit situated in the level above in order for the cable passages not to be directly situated below a pipe. At the location of the cable passages are situated connection sockets accessible from the premises for connecting racks. The electrical network grid may thus constitute a constraint for the placement of the racks, in particular with regard to their power needs. For example, the racks requiring high power must be placed in the vicinity of the cable passages to be connected to the source of highest power 232.

Once the physical constraints of the premises are known, it is possible to refine the design of the cluster.

For example, the items of equipment with a high electrical power consumption must be connected to the source 203 since this is the largest electrical power source. This means that these items of equipment must be located at the corner of the premises in which that source is located.

For example again, the electrical load must be distributed but most of the items of equipment must have redundant power supply. It is thus necessary to distribute the items of equipment in an optimized manner, taking into account other constraints: distance, redundancy, electrical phase, or other constraints.

According to the invention, a library of components stores the characteristics of those components, in particular their dimensions, their electrical consumption, the list of the components which are associated with them (supply, network connection, etc.), or any other characteristic.

The library is associated with a set of rules for installation of the items of equipment. For example, this may be a matter of indicating that a type of equipment having to be cooled by water circulation must be situated in the vicinity of a water inlet, or for instance of distributing the items of equipment according to their electrical power consumption and the distribution of the electrical sources in the room, etc.

According to the invention, based on the brief defining the requirements to be met by the cluster, components of the library are selected. When this selection is made, the geometrical definition of the premises and the physical constraints thereof are taken into account. For this, the installation rules associated with the library are applied.

This selection results in a list of items of equipment ("Netlist") as well as their configuration in terms of hardware configuration (in particular the interconnections between those items of equipment) and in terms of spatial configuration within the premises.

If it is not possible to select such equipment, it is possible to generate an empty list. Alternatively, a list is generated with a message indicating the adaptation works to be carried out in the premises (for example need for an additional electrical source, need for additional space, or other need).

Based on this list, it may be easy for the designer to put a figure to the overall cost of the cluster and possibly to have an estimation made of the possible cost of adaptation works to be carried out on the premises.

To facilitate the design, it is possible to display a view in three dimensions of the premises making it possible to apprehend the geometrical configuration of the premises, the physical constraints thereof and the arrangement of the cluster.

Such a view is illustrated in FIG. 3.

It constitutes a software graphical interface, more commonly referred to as a "window", comprising a first frame 300 in which a three dimensional representation of the cluster installed on the premises is displayed. This representation adopts the same reference signs as FIGS. 1 and 2.

Two racks 301, 302 of the cluster are represented in three dimensions according to an arrangement determined according to the brief, the geometry of the premises, its physical constraints and the installation rules. In the interest of concision, only two racks have been represented but in reality a cluster comprises a higher number of racks.

In the present example, the rack 301 is connected to the electrical source 202 and to the cable raceway 206. The rack 302 is connected to the electrical source 203 and to the cable raceway 205.

The components may be represented using a color code by type or by state in order to bring the representation closer to reality.

The user may navigate in the premises by performing zooms onto selected zones and by moving the view to see the premises from different perspectives.

The list of the components selected to constitute the cluster is displayed in a frame 303 in order to enable the user to know all the components present in the cluster. To be precise, it is possible for the three-dimensional view of the racks not to be sufficient to know the content of each rack.

The user may also modify the cluster by adding or by deleting components. To that end, a frame 304 displays the library of components according to the invention.

For example, the user selects a component from the library then drags it from the frame 304 and drops it into the frame 300 ("drag and drop" operation). A process of updating the list is then carried out. For example, one or more installation rules are applied to determine whether or not it is possible to add or delete a component.

If that proves to be possible, the list is modified and the three-dimensional view is also modified.

A data center design aid tool according to the invention thus makes it possible to provide a user (for example a designer or a person having the task of replying to a call for tenders) with:
- a full catalog of the equipment (components) available to produce a cluster (node models, switch models, storage bay models, or other equipment),
- an interface making it possible to intuitively define (geometrical data (x, y, z)) the premises provided to receive the cluster,
- the possibility of defining the physical constraints associated with the premises (raised floor, cable passages, air conditioning inlets, water inlets, electrical supplies, or other constraints),
- the possibility of defining an arrangement of the components available in the catalog to form the cluster (positioning of the components in the 2D or 3D representation of the premises),
- the possibility of making the connections between the various objects (electrical network, Ethernet network, interconnections, etc.) by automatically using distance optimization algorithms,
- the possibility of designing a cluster taking into account, from the beginning, configuration rules specific to the clusters (location of the connections, architecture optimization, or other configuration rules),
- the automatic integration of the hardware dependencies (thus, for example, when the user selects a node from the library, a supply is automatically associated with the node, for a further example, if it is a service node, a dual supply is selected if it requires a dual supply).

According to one embodiment, the design aid tool according to the present invention is used by "pre-sale" departments (that is to say the marketing phase preceding the industrial design phase) to be able to apprehend the feasibility of a cluster according to the needs of the client, according to the available premises for receiving the cluster and according to the equipment available for producing the cluster. It may also be used to put a figure on such a project.

An interface according to the present invention, for example an interface according to FIG. 3, makes it possible to have a view of the final cluster installed on the premises that is close to reality: positioning of the racks, positioning of the various items of equipment in the racks.

According to embodiments, it is possible to simulate the power rise (that is to say the energy dissipation) of the cluster. This is for example a matter of calculating the energy consumption and heat loss of the cluster and of providing a graphical representation of the results. It is thus possible to determine whether the electrical load demanded by the cluster is in keeping with the power available within the premises and with the cooling capacities. Adaptation works for the premises may then be decided upon on the basis of this simulation.

It is also possible to determine the maximum number of nodes (with the items of equipment from which they themselves depend) and thus the theoretical maximum power (in FLOPS).

The energy envelope, the dimensions of the premises, and the computation power may be preponderant criteria in a brief for a cluster.

The interface according to the invention enables the user to process all these criteria in real time to design the cluster, and possibly to correct certain aspects, for example, according to previous cluster projects.

The present invention may be implemented in software form. For example, in Java language.

The graphical interface, in particular the view in frame 300 may be made in several levels:
- overall (complete plan of the premises).
- overall with the constraints (plan of the premises with a representation of the raised floor, the electrical sources, the air conditioning, etc.),
- overall, with the equipment (plan of the premises, physical constraints and equipment),
- view per rack,
- view per energy consumption (color diagram to show the zones in which the consumption is the highest);
- view per heat loss (color diagram to show the zones in which the heat loss is the highest),
- view per network (Ethernet administration, Ethernet BMC, electrical interconnection, etc.),
- view per item of equipment (view of all the interdependencies of an item of equipment),
- view of the air flows (simulation of the air streams generated by the items of equipment with the information in the attributes for the items of equipment) at the location of the fans and their direction of air circulation to enable the heat exchanges to be optimized by locating the hot flows relative to the cold flows.

The tool according to the present invention may make it possible to generate the "Netlist" (that is to say the complete list of the components to order, the rules for assembly and for cabling).

In one embodiment, the tool making it possible to define the role of each node in the cluster and to define the associated software profile (list of packets to install, configuration).

Figure 4:
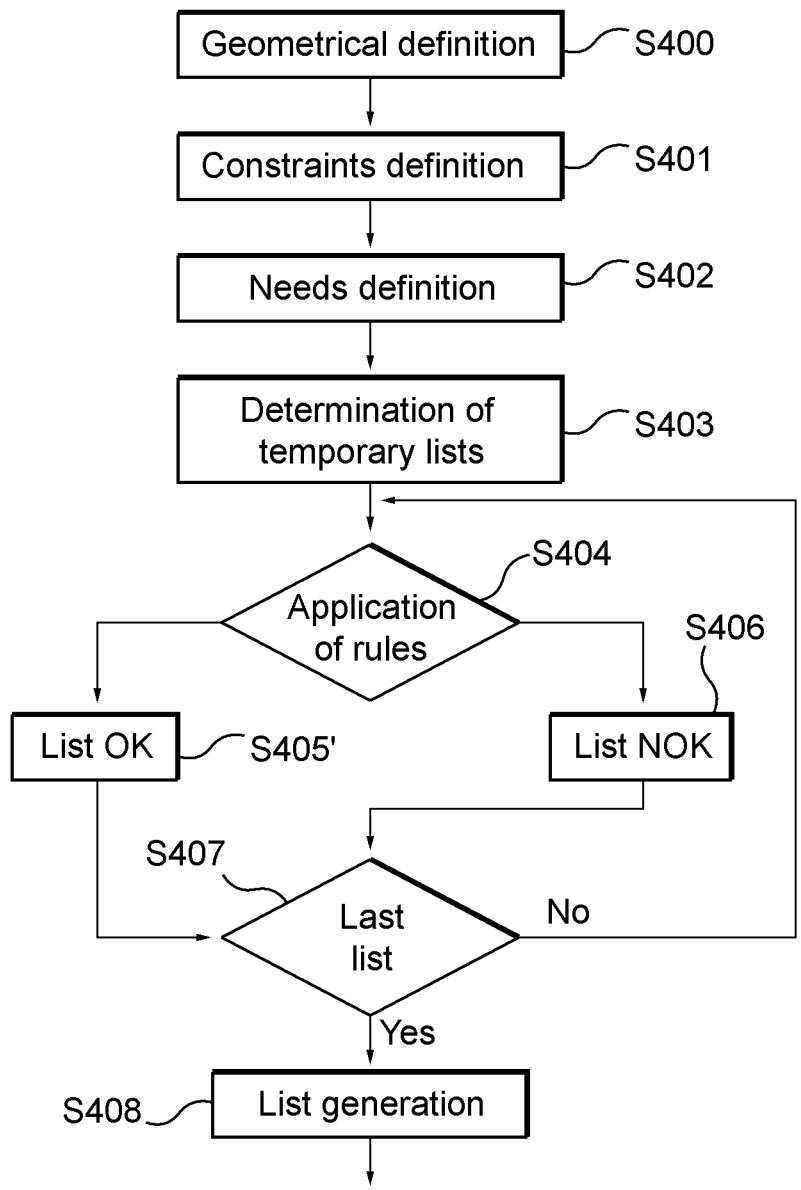
FIGS. 4 and 5 are flowcharts of steps implemented in embodiments.

FIG. 4 is a flowchart of steps implemented in an embodiment.

A technical brief is established and comprises a set of criteria on the needs the cluster must satisfy. A plan of the premises for receiving the cluster is also established.

The user then launches a software application on a computer (or on any other device configured for implementing the method).

At a first step S400, for example via a graphical interface, the user geometrically defines the premises. For example, he inputs the dimensions of the premises with a keyboard. Alternatively, the user loads a three-dimensional modeling file describing the geometry of the premises.

Next, at a step S401, the user defines the constraints of the premises. For example, the software interface offers him "standard" constraints that are often encountered in premises receiving clusters. These may be false floors, water inlets, electrical connections, doors, ventilation openings, cable raceways or other constraints. The user may also specify the maximum weight supported, the maximum total electrical power available in the premises, the air conditioning power, etc.

As for the geometrical definition of the premises, these data may be loaded from a dedicated file.

At a step S402, the needs the cluster must satisfy are defined, for example, in particular:
the needs in terms of raw performance (FLOPS),
the needs in terms of memory per node and/or total memory,
the needs in terms of storage,
the needs in terms of network bandwidth for administration,
the needs in terms of bandwidth and latency of the interconnect network,
the needs in terms of connection with the outside (backbone) with required rate and types of connection (fiber, copper, or other type).

Once the premises has been defined geometrically and by its physical constraints and once the needs of the cluster are known, one or more temporary lists of components of the library of components meeting the needs is established at a step S403. In a first phase, the premises is not taken into account. Such a step makes it possible for example to start from previous cluster projects. At this step, hardware dependency rules may be applied to determine the components to include in the list, whose presence arises from the use of another item of equipment to meet a need of the brief.

Once step S403 has been executed, one or more lists are available. Next it is a matter of determining from among those lists, the one that enables an installation in the premises as defined by its geometry and by its physical constraints.

An arrangement algorithm is then implemented to determine whether for each list, all the equipment may be installed within the premises. This algorithm combines a set of installation rules and is implemented at step S404.

For example, determination is made of the number of racks to use to group together all the components, then the surface area occupied by that number of racks (possibly taking into account a spacing between the racks) is compared with the surface area available on the premises. This this makes it possible to make a first selection from the lists. More particularly, if the surface area occupied by the racks is greater than the surface area of the premises, it is not possible to arrange the cluster in the premises.

Next, account is taken of installation rules for example such as the distribution of the electrical sources, the water inlets, the ventilation, or other rules. The order of application of the rules may for example depend on the importance which is given to each one or to the filtering capacity of each rule. It is to be recalled that the application of the rules, in addition to ensuring that the components enable the cluster to meet the needs and to ensuring that the cluster is able to be installed in the premises, is directed to selecting the best list from among those determined at step S403.

When a list satisfies the rules applied at step S404, it is stored at step S405. When a list does not satisfy the rules applied at step S404, it is deleted at step S406.

At step S407, it is determined whether all the lists generated at step S404 have been considered. If lists remain to which the rules have not been applied, step S404 is returned to.

If all the lists have been considered, a final list is generated at step S408. It is possible to consider the case of several lists satisfying the rules of step S404. It is then the user who chooses the list which is the most appropriate. Alternatively, the lists are sorted on the basis of predetermined criteria for example such as the optimization of cost, the complexity of implementation, the number of items of equipment required, or other criteria. This makes it possible to select the best solution for a given criterion.

In the example described with reference to FIG. 4, the needs of the cluster have been considered before the geometry of the premises and its physical constraints. However, in an alternative manner, it is possible to consider the geometry of the premises and its constraints first of all to obtain temporary lists, then to use the needs to satisfy to select one or more lists from among those temporary lists.

Figure 5:
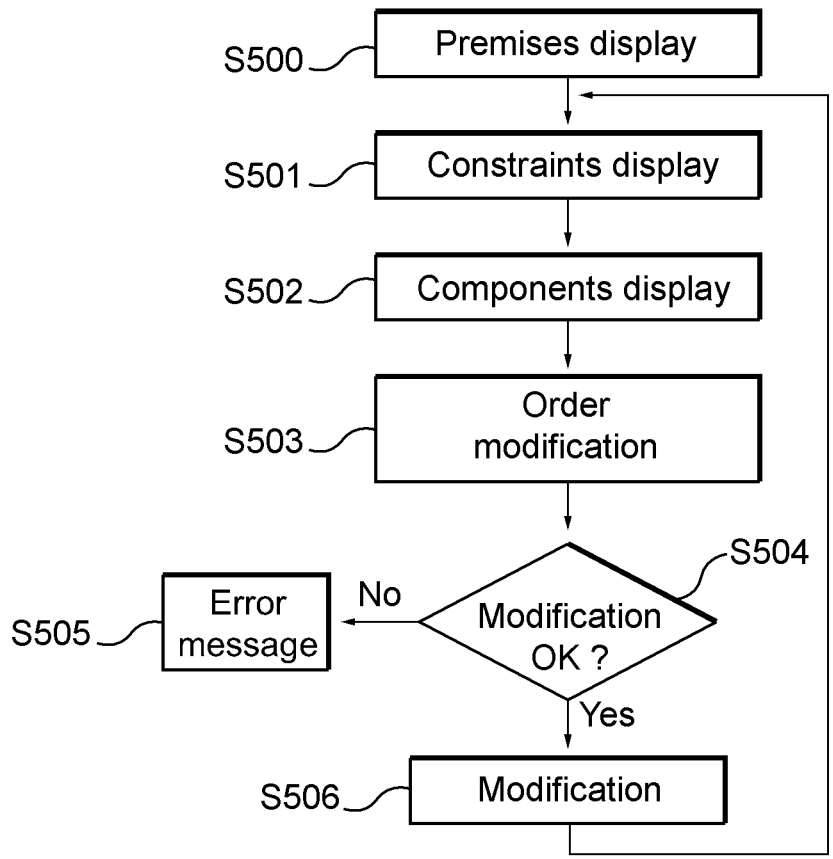

FIG. 5 illustrates steps implemented to enable the user to modify (or adjust) the cluster in real time.

At a step S500, a graphical representation of the premises is displayed on a screen. This representation may be in two or three dimensions. The user may navigate in this representation by varying the viewing angles. Such a representation is illustrated by FIG. 1.

At a step S501, the physical constraints of the premises are added to the geometrical representation of the premises. The representation of the premises resulting from such a step is illustrated by FIG. 2.

Next, starting from the list of components of the cluster, for example generated at a step such as step S408, the components of the cluster are displayed in the representation of the premises, according to an arrangement satisfying the installation rules, for example as applied during step S404.

At this stage, the user may still navigate within the representation of the premises, as was presented with reference to FIG. 3.

The triggering of steps S500, S501 and S502 may be made automatically or by the action of the user, for example by clicking on a dedicated button (not shown) in the interface according to FIG. 3. In particular, the display of the components may be triggered by the selection by the user of a list from among a set of lists generated at a step such as step S408.

Returning to FIG. 5, when the user wishes to modify the represented cluster, he issues a command for this which is received at step S503. For example, this is a matter of dragging and dropping a component from frame 304 of FIG. 3 to frame 300 of the same Figure.

When such a command is received, it is determined whether it is possible to modify the list while continuing to comply with the needs of the cluster and the installation rules. This verification is implemented at step S504.

If it is not possible to modify the list, an error message is displayed to the user at step S505.

If it is possible to modify the list, the new list modified at step S506 then the display of the cluster is updated by returning to step S502.

The display of the cluster may be made according to a level of detail making it possible to modify the cluster at a very low or very high level. For example, it may be possible to position complete racks "pre-assembled" with nodes already positioned. It may also be possible to be able to change the processor of a node (or of a group), modify the type of memory (different frequency), etc.

After a cluster modification, the impact of certain criteria may be presented, for example such as the energy envelope, the total performance change, the distribution of heat losses, etc.

To that end, a specific representation of the premises may be displayed, for example such as a map of the heat losses with red zones at the locations of the premises at which the loss is high and blue zones at the locations in which it is less high, with a color gradient for the intermediate zones. The same type of map may be envisioned for the electrical consumption, etc.

It is thus possible to obtain a realistic representation of the premises (computer room) with the cluster installed, with for example all the cabling (port to port).

The list of the components of the cluster may constitute a "Netlist" containing all the elements of the solution (number of the nodes of type N, number of PDUs of type X, number, size and type of cables, etc.) as well as their interconnections.

The present invention can enable basic solutions to be generated automatically to meet needs of a brief according to a simple schema in which a set of parameters is provided then, from a library of components that are "usable" (or available from the manufacturer of the cluster) a solution is generated. This automatically generated solution makes it possible to have a first version of the cluster which may be refined subsequently.

The present invention makes it possible to rapidly and intuitively evaluate the feasibility and possibly the cost of producing a cluster and of its implementation.

According to the invention, the final installation of the cluster may be taken into account very early in the design of the cluster.

Furthermore, the representation may make it possible to generate cabling labels and provide the persons having the task of installing the cluster with a precise list of the positions and connections between the items of equipment constituting the cluster. These labels may give the model and length of the cables.

The present invention may be implemented by computer means for example such as a computer. It is possible to envision a local execution of a software application implementing a method according to the invention or a remote execution. The library of components may have a large size in memory. Thus, it may be advantageous to have the library and the software application implementing a method according to the invention within an application server which several users may access.

A computer program for the implementation of a method according to one embodiment of the invention may be produced on reading the flowcharts of FIGS. 4 and 5 and the present detailed description.

A device for aiding the design by computer of a data center (cluster) according to one embodiment is described with reference to FIG. 6.

Figure 6:
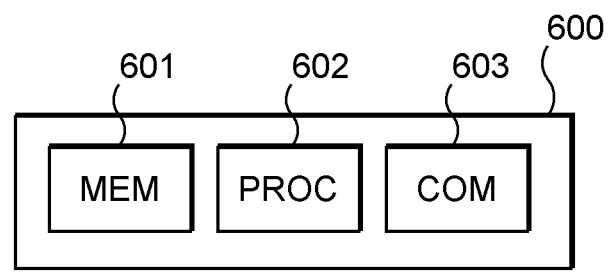
FIG. 6 is a diagrammatic illustration of a device according to an embodiment of the invention.

The device 600 of FIG. 6 comprises a memory unit 601 (MEM). This memory unit comprises a random access memory for temporary storage of the computation data used during the implementation of a method according to the invention, according to various embodiments, for example the temporary lists determined at step S403. The memory unit furthermore comprises a non-volatile memory (for example of EEPROM type) for example for storing a computer program according to an embodiment, for its execution by a processor (not represented) of a processing unit 602 (PROC) of the device. The memory unit may for example store the geometrical definition of the premises, the physical constraints, the library of components, all the installation rules, the needs to satisfy, and the lists generated at step S408. The memory unit may also store descriptions of pre-existing projects with for example lists of components, geometrical definitions of premises, definitions of physical constraints, or other definitions.

The device furthermore comprises a communication unit 403 (COM) to receive for example commands from the user, send display data to a screen (not shown), or receive files describing the geometry of a premises, the physical constraints, the needs to satisfy, etc.

The communication unit may furthermore be configured to communicate with a server (not shown) storing the library of components.

In a more detailed architecture (not shown), the device comprises:
- a module for definition of needs (total computation power, overall memory size or memory size per node, computing size, rates or other needs),
- a module for storage of the library of components, the data associated with the components and the installation rules,
- a room plan management module, for example a 3D module (floor plan, raised floor, passage of cables, energy management, air conditioning management, weight management, water supply, etc.),
- a graphics engine for creating combined objects (creation of a rack and of its components on the basis of the library while complying with the constraints),
- a rack management module (management of the installation of the components in the rack, management of the associated constraints, management of the hardware dependencies, etc.),
- an inter-rack interconnection management module
- an module for energy management, for example in order to determine a map of the energy consumption of the cluster,
- a heat loss management module, for example for determining a heat loss map for the cluster,
- an engine for overall management of the installation rules (application of the dependency rules, cabling rules, rules for linking items of equipment together, etc.),
- a network (Ethernet, interconnection, electrical storage, etc.) management module,
- a module for optimization of the arrangement (placing the nodes, cable lengths, etc.), and
- a module for automatic generation of an initial configuration depending on the supplied criteria.

Of course, the present invention is not limited to the described embodiments, other variants and combinations of features are possible.

The present invention has been described and illustrated in the present detailed description with reference to the appended Figures. However the present invention is not limited to the embodiments presented. Other variants and embodiments may be deduced and implemented by the person skilled in the art on reading the present description and appended Figures.

In the claims, the term "comprise" does not exclude other elements or other steps. The indefinite article "a" does not exclude the plural. A single processor or several other units may be used to implement the invention. The different features presented and/or claimed may advantageously be combined. Their presence in the description or in different dependent claims, does not indeed exclude the possibility of combining them. The reference signs are not to be understood as limiting the scope of the invention.

What is claimed is:

1. A computer-implemented method of optimizing a design of a data center, comprising:
   geometrically defining, via a processor or graphical interface of a computer, or both, a premises for receiving the data center in terms of three dimensions as a geometrical definition;
   defining, via said processor or said graphical interface of the computer, or both, physical constraints associated with the premises as a constraints definition;
   supplying, via the processor of the computer, a library of data center components for a hardware definition of the data center, the library being associated with a set of installation rules for the data center components;
   defining, via the processor or the graphical interface of the computer, or both, a list of needs to satisfy by the data center as a needs definition;
   determining, via the processor, temporary lists of components of the library that comply with the needs definition, the temporary lists including a preexisting list of components generated for a previous project, the temporary lists of components being determined without taking into account geometrical characteristics, or the physical constraints, or both, of the premises;
   determining, via the processor, from among the temporary lists, final lists of components that comply with the geometrical definition, the constraints definition, and at least one installation rule of the set of installation rules, and it being possible for the final lists to be empty if it is not possible to find components complying with the geometrical definition, the constraints definition, and the at least one installation rule;
   transmitting the final lists of components by a communication unit of the computer to a user so that the user has access to all lists of components that comply with the geometrical definition, the constraints definition, and said at least one installation rule of the set of installation rules and such that the user can select a list of components from among the final lists for designing the data center;
   displaying, on a display of the computer, a graphical representation of the data center installed on the premises and designed in accordance with the list of components from among the final lists selected by the user;
   after said displaying, receiving a command from the user, via said graphical interface of the computer, to change one or more components of the list of components from among the final lists selected by the user to define a modified list of components; after receiving said command, determining, via the processor, whether it is possible to modify the list of components selected by the user by changing said one or more components while continuing to comply with the geometrical definition, the constraints definition, and the at least one installation rule of the set of installation rules, and
   after receiving said command, when it is determined that the modified list of components continues to comply with the geometrical definition, the constraints definition, and the at least one installation rule of the set of installation rules, displaying, on the display of the computer, a different graphical representation of the data center installed on the premises and designed in accordance with the modified list of components,
   after receiving said command, when it is determined that it is not possible to modify the list of components based on the modified list of components not complying with the geometrical definition, the constraints definition, and the at least one installation rule of the set of installation rules, generating an error message that is displayed to the user and generating an empty list of components,
   wherein the graphical interface simultaneously displays on said display the graphical representation of the data center installed on the premises in a first frame of the graphical interface and the library of said data center components in a second frame of the graphical interface, and
   wherein said receiving of the command from the user, via the graphical interface of the computer, to change said one or more components of the list of components from among the final lists selected by the user to define the modified list of components includes selecting a first component in the library of said data center components and then dragging said first component from the second frame to the first frame and,
   wherein, following said dragging, the processor determines whether it is possible to modify the list of components selected by the user by adding said first component to the list of components selected by the user while continuing to comply with the geometrical definition, the constraints definition, and the at least one installation rule of the set of installation rules, and
   on condition that the processor determines that it is possible to modify the list of components selected by the user by adding said first component to the list of components selected by the user while continuing to comply with the geometrical definition, the processor modifies the list of components selected by the user and displays the different graphical representation of the data center with the first component that is added.

2. The computer-implemented method according to claim 1, further comprising implementing a hardware dependency rule whereby an installation of one component involves an installation of at least one other component.

3. The computer-implemented method according to claim 1, wherein the list of components selected by the user is generated based on a preexisting virtual representation of said of a data center.

4. The computer-implemented method according to claim 1, further comprising displaying at least a portion of the list of components selected by the user within the graphical representation of the data center installed on the premises that is displayed.

5. The computer-implemented method according to claim 4, further comprising implementing an algorithm for optimization of distance between the components to distribute the components of the list of components selected by the user in the graphical representation of the data center installed on the premises.

6. The computer-implemented method according to claim 1, wherein the physical constraints comprise at least one of:
a maximum weight supported by the premises,
a maximum electrical power supported,
a maximum air-conditioning power available,
a configuration of cable raceways,
a water supply configuration,
a configuration of a network connection with an outside,
a configuration of electrical connections,
a configuration of cold points, and
a configuration of hot points.

7. The computer-implemented method according to claim 1, wherein the list of needs comprises at least one of:
computation performance needs,
memory quantity needs,
bandwidth needs, and
data rate needs.

8. A tangible, non-transitory, machine-readable medium storing instructions that when executed by at least one processor of a device cause the at least one processor to perform operations comprising a computer-implemented method of optimizing a design of a data center, said computer-implemented method comprising:
geometrically defining, via a processor or graphical interface of a computer, or both, a premises for receiving the data center in terms of three dimensions as a geometrical definition;
defining, via said processor or said graphical interface of the computer, or both, physical constraints associated with the premises as a constraints definition;
supplying, via the processor of the computer, a library of data center components for a hardware definition of the data center, the library being associated with a set of installation rules for the data center components;
defining, via the processor or the graphical interface of the computer, or both, a list of needs to satisfy by the data center as a needs definition;
determining, via the processor, temporary lists of components of the library that comply with the needs definition, the temporary lists including a preexisting list of components generated for a previous project, the temporary lists of components being determined without taking into account geometrical characteristics, or the physical constraints, or both, of the premises;
determining, via the processor, from among the temporary lists, final lists of components that comply with the geometrical definition, the constraints definition, and at least one installation rule of the set of installation rules, and it being possible for the final lists to be empty if it is not possible to find components complying with the geometrical definition, the constraints definition, and the at least one installation rule;
transmitting the final lists of components by a communication unit of the computer to a user so that the user has access to all lists of components that comply with the geometrical definition, the constraints definition, and said at least one installation rule of the set of installation rules and such that the user can select a list of components from among the final lists for designing the data center;
displaying, on a display of the computer, a graphical representation of the data center installed on the premises and designed in accordance with the list of components from among the final lists selected by the user;
after said displaying, receiving a command from the user, via said graphical interface of the computer, to change one or more components of the list of components from among the final lists selected by the user to define a modified list of components;
after receiving said command, determining, via the processor, whether it is possible to modify the list of components selected by the user by changing said one or more components while continuing to comply with the geometrical definition, the constraints definition, and the at least one installation rule of the set of installation rules, and
after receiving said command, when it is determined that the modified list of components continues to comply with the geometrical definition, the constraints definition, and the at least one installation rule of the set of installation rules, displaying, on the display of the computer, a different graphical representation of the data center installed on the premises and designed in accordance with the modified list of components,
after receiving said command, when it is determined that it is not possible to modify the list of components based on the modified list of components not complying with the geometrical definition, the constraints definition, and the at least one installation rule of the set of installation rules, generating an error message that is displayed to the user and generating an empty list of components,
wherein the graphical interface simultaneously displays on said display the graphical representation of the data center installed on the premises in a first frame of the graphical interface and the library of said data center components in a second frame of the graphical interface, and
wherein said receiving of the command from the user, via the graphical interface of the computer, to change said one or more components of the list of components from among the final lists selected by the user to define the modified list of components includes selecting a first component in the library of said data center components and then dragging said first component from the second frame to the first frame and,
wherein, following said dragging, the processor determines whether it is possible to modify the list of components selected by the user by adding said first component to the list of components selected by the user while continuing to comply with the geometrical definition, the constraints definition, and the at least one installation rule of the set of installation rules, and
on condition that the processor determines that it is possible to modify the list of components selected by the user by adding said first component to the list of components selected by the user while continuing to comply with the geometrical definition, the processor modifies the list of components selected by the user and displays the different graphical representation of the data center with the first component that is added.

9. A device for optimizing a computer-implemented design of a data center, comprising:
a communication unit configured to receive:
a geometrical definition of a premises in terms of three dimensions provided to receive the data center as said geometrical definition,
a definition of physical constraints associated with the premises as a constraints definition, and
a definition of a list of needs to satisfy by the data center as a needs definition; and a processing unit configured to:
- determine temporary lists of components of a library of data center components that comply with the needs definition, the temporary lists including a preexisting list of components generated for a previous project, the temporary lists of components being determined without taking into account geometrical characteristics, or the physical constraints, or both, of the premises, wherein the library of said data center components defines hardware of the data center, the library being associated with a set of rules for installation of the components in said in a data center;
- determine from among the temporary lists, final lists of components that comply with the geometrical definition, the constraints definition, and at least one installation rule of the set of rules for installation, and it being possible for the final lists to be empty if it is not possible to find components complying with the geometrical definition, the constraints definition, and the at least one installation rule; and a display, wherein the communication unit is configured to transmit the final lists of components to a user so that the user has access to all lists of components that comply with the geometrical definition, the constraints definition, and the at least one installation rule of the set of rules for installation and such that the user can select a list of components from among the final lists for designing the data center, wherein the display is configured to display a graphical representation of the data center installed on the premises and designed in accordance with the list of components selected by the user;

wherein the processing unit is configured
- to receive, after displaying the graphical representation of the data center, a command from the user to change one or more components of the list of components selected by the user to define a modified list of components,
- after receiving said command, to determine whether it is possible to modify the list of components selected by the user by changing said one or more components while continuing to comply with the geometrical definition, the constraints definition, and the at least one installation rule of the set of rules for installation, and wherein after receiving said command, when it is determined that the modified list of components continues to comply with the geometrical definition, the constraints definition, and the at least one installation rule of the set of rules for installation, the display is configured to display a different graphical representation of the data center installed on the premises and designed in accordance with the modified list of components, wherein after receiving said command, when it is determined that it is not possible to modify the list of components based on the modified list of components not complying with the geometrical definition, the constraints definition, and the at least one installation rule of the set of installation rules, the processing unit is further configured to generate an empty list of components and the display is further configured to generate an error message that is displayed to the user, wherein the display is configured to simultaneously display the graphical representation of the data center installed on the premises in a first frame of the display and the library of said data center components in a second frame of the display, wherein the command received by the processing unit from the user, to change said one or more components of the list of components selected by the user to define the modified list of components includes a selection of a first component in the library of said data center components and then dragging said first component from the second frame to the first frame and, wherein, following said dragging, the processing unit is configured to determine whether it is possible to modify the list of components selected by the user by adding said first component to the list of components selected by the user while continuing to comply with the geometrical definition, the constraints definition, and the at least one installation rule of the set of rules for installation, and on condition that the processing unit determines that it is possible to modify the list of components selected by the user by adding said first component to the list of components selected by the user while continuing to comply with the geometrical definition, the processing unit is configured to modify the list of components and display the different graphical representation of the data center with the first component that is added.

10. The device according to claim 9, further comprising a memory unit configured to store the library.

11. The device according to claim 9, wherein the communication unit is configured to communicate with a server storing the library.

12. The device according to claim 9, wherein the processing unit is further configured to implement a hardware dependency rule whereby the installation of one component involves the installation of at least one other component.

13. The device according to claim 9, wherein the list of components selected by the user is generated based on a preexisting virtual representation of said data center.

14. The device according to claim 9, wherein the processing unit is further configured to control the display of the graphical representation of the data center installed on the premises, and of the components of the list of components selected by the user within the graphical representation of the data center installed on the premises that is displayed.

15. The device according to claim 14, wherein the processing unit is further configured to implement an algorithm for optimization of distance between the components to distribute the components of the list of components selected by the user in the graphical representation of the premises.

16. The device according to claim 9, wherein the physical constraints comprise at least one of:
- a maximum weight supported by the premises,
- a maximum electrical power supported,
- a maximum air-conditioning power available,
- a configuration of cable raceways,
- a water supply configuration,
- a configuration of a network connection with an outside,
- a configuration of electrical connections,
- a configuration of cold points, and
- a configuration of hot points.

17. The device according to claim 9, wherein the list of needs comprises at least one of:
- computation performance needs,
- memory quantity needs,
- bandwidth needs, and
- data rate needs.

18. The computer-implemented method according to claim 1, wherein the at least one installation rule governs at least spacing between the components of the list of components selected by the user with respect to final positioning of the components to be installed in the geometrical definition of the data center.

19. The computer-implemented method according to claim 1, wherein a rack that includes at least one component of the list of components selected by the user and that requires most cooling is connected to a coldest connection point of a plurality of connection points of the premises.

20. The computer-implemented method according to claim 1, wherein a rack that includes at least one component of the list of components selected by the user and that requires most power is connected to a most powerful power source of a plurality of power sources of the premises.

21. The computer-implemented method according to claim 1, further comprising:
generating a list with a message indicating adaptation works to be carried out in the premises, if it is not possible to find said components complying with the geometrical definition, the constraints definition, the needs definition, and the set of installation rules.

22. The computer-implemented method according to claim 1, wherein the final lists are sortable based on predetermined criteria, the predetermined criteria including one or more of optimization of cost, complexity of installation, and a number of required components.

23. The computer-implemented method according to claim 1, wherein the set of installation rules relate to connections, positions, maximum lengths, and maximum curvature radii of cables to be used for installing the components of the list of components selected by the user.

24. The computer-implemented method according to claim 21, wherein the final lists are generated such that an estimate of costs to perform the adaptation works is made.

25. The computer-implemented method according to claim 1, further comprising generating cabling labels at least one of which displays a model and length of a cable to be used for installing a component of the list of components selected by the user.

26. The computer-implemented method according to claim 1, wherein the graphical interface simultaneously displays on said display the graphical representation of the data center installed on the premises in the first frame of the graphical interface, the library of said data center components in the second frame of the graphical interface and the list of components selected by the user in a third frame of the graphical interface.

* * * * *